US008269506B2

(12) United States Patent
Liang et al.

(10) Patent No.: US 8,269,506 B2
(45) Date of Patent: Sep. 18, 2012

(54) SIGNAL INTEGRITY TEST SYSTEM AND METHOD

(75) Inventors: Hsien-Chuan Liang, Taipei Hsien (TW); Shen-Chun Li, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 280 days.

(21) Appl. No.: 12/854,912

(22) Filed: Aug. 12, 2010

(65) Prior Publication Data

US 2011/0316555 A1 Dec. 29, 2011

(30) Foreign Application Priority Data

Jun. 25, 2010 (CN) .................................. 99 1 20969

(51) Int. Cl.
*G01R 31/02* (2006.01)
*G06F 15/00* (2006.01)

(52) U.S. Cl. .................... 324/537; 324/555; 324/756.01; 702/117; 702/121

(58) Field of Classification Search .................. 324/537, 324/555, 73.1, 754.07, 755.01; 702/108, 702/117, 118, 121
See application file for complete search history.

(56) References Cited

U.S. PATENT DOCUMENTS

2005/0222798 A1* 10/2005 Waschura et al. ............. 702/127
* cited by examiner

*Primary Examiner* — Vincent Q Nguyen
(74) *Attorney, Agent, or Firm* — Altis Law Group, Inc.

(57) ABSTRACT

A signal integrity test system and method uses an oscilloscope to test a signal on each test point of a transmission line, obtains test parameter values of the signal on each test point, and compares the test parameter values with preset standard values. If any test parameter value does not match a corresponding preset standard value, a time-domain reflectometer is used to test an impedance value of the test point. If the impedance value matches a standard impedance value of the transmission line, the system and method determines the signal on the test point satisfies integrity requirements.

20 Claims, 4 Drawing Sheets

SIGNAL INTEGRITY TEST SYSTEM AND METHOD

BACKGROUND

1. Technical Field

Embodiments of the present disclosure relates to signal test systems and methods, and more particularly, to a signal integrity test system and method.

2. Description of related art

Transmission lines are capable of carrying signals between a transmitter (e.g., a first conductor) and a receiver (e.g., a second conductor). To ensure integrity of a signal, characteristic impedance of a transmission line should meets a specified value along the length of the transmission line. At present, the signal integrity tests by manually testing the characteristic impedance of all test points on the transmission lines.

DETAILED DESCRIPTION

The disclosure is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
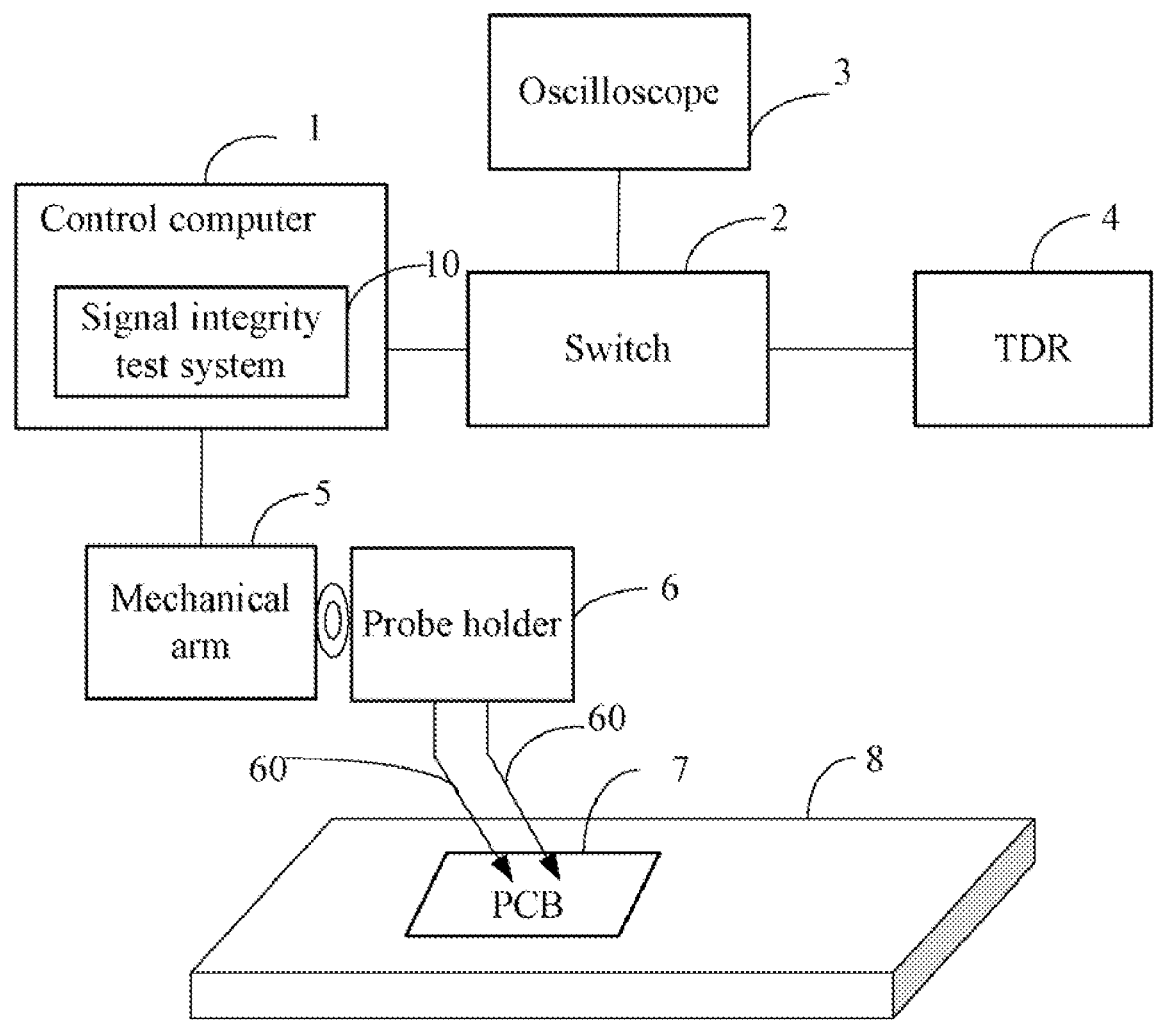
FIG. 1 is a block diagram of one embodiment of an application environment of a signal integrity test system.

FIG. 1 is a block diagram of one embodiment of an application environment of a signal integrity test system 10. In one embodiment, the signal integrity test system 10 is included in a control computer 1. The control computer 1 is connected to an oscilloscope 3 and a time-domain reflectometer (TDR) 4 through a switch 2. The control computer 1 is further connected to a mechanical arm 5. A probe holder 6 is configured at an end of the mechanical arm 5. Probes 60 of the oscilloscope 3 or the TDR 4 can be grasped by the probe holder 50 and positioned on a printed circuit board (PCB) 7. In one embodiment, the PCB 7 is positioned on a test platform 8.

Referring to FIG. 1, the signal integrity test system 10 may be used to send position commands to the mechanical arm 5, where the position commands are used by the mechanical arm 5 to drive the probe holder 6 to grasp the probes 60 of the oscilloscope 3 or the TDR 4 and positions the probes 60 on the PCB 7. The oscilloscope 3 or the TDR 4 collects test data regarding the PCB 7 and sends the test data to the control computer 1 through the switch 2. The test data is compared with preset standard values to determine if the test data is acceptable, to determine if the signal transmitted in the PCB satisfies integrity requirements. A detailed description will be given in the following paragraphs.

Figure 2:
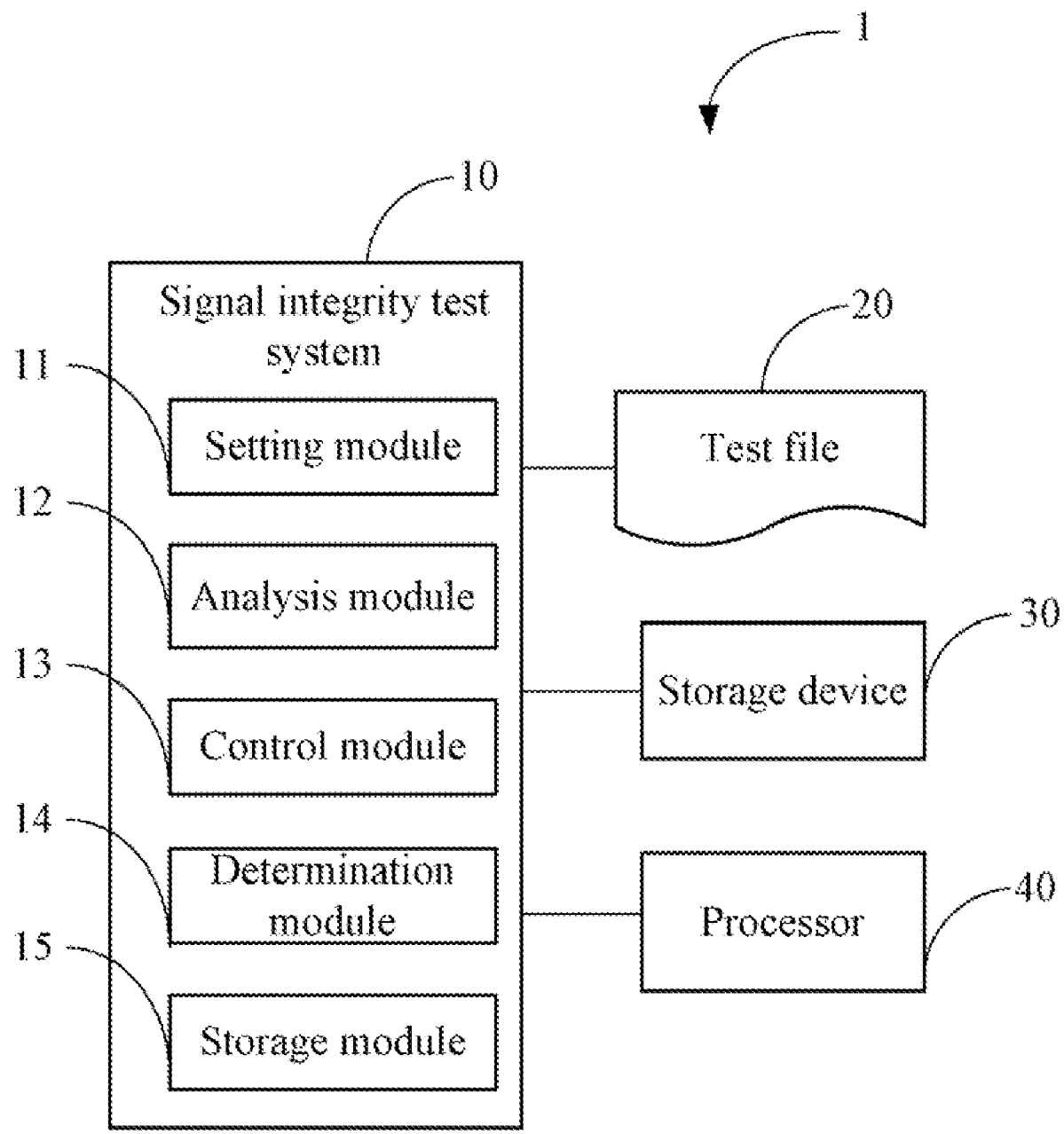
FIG. 2 is a block diagram of one embodiment of function modules of the signal integrity test system in FIG. 1.

FIG. 2 is a block diagram of one embodiment of function modules of the signal integrity test system 10 in FIG. 1. In one embodiment, the signal integrity test system 10 includes programs including a setting module 11, an analysis module 12, a control module 13, a determination module 14, and a storage module 15. One or more computerized codes of the modules 11 to 15 are stored in a storage device 30 of the control computer 1, where a processor 40 of the control computer 1 executes the one or more computerized codes, to provide one or more aforementioned operations of the signal integrity test system 10. Depending on the embodiment, the storage device 30 may be a smart media card, a secure digital card, or a compact flash card.

The setting module 11 receives test parameters of a signal to be tested and a reference value range of each test parameter set by a user. Depending on the embodiment, the signal may be a peripheral component interconnection (PCI) signal, a serial peripheral interface (SPI) signal, a clock signal, a front side bus (FSB) signal, a voltage signal, or any other kind of electronic signal. The test parameters may include an overshoot, an undershoot, a slew rate, a raise time, a fall time, a high voltage, and a low voltage of the signal.

The analysis module 12 reads a test file 20 from the storage device 30, analyzes the test file 20 to acquire information about one or more transmission lines on the PCB 7, and selects a transmission line to be tested. In one embodiment, the test file 20 may record a number of transmission lines on the PCB 7, a name and a length of each transmission line, coordinate information of test points on the transmission line, and an impedance reference value range of the transmission line.

The control module 13 generates a first command according to coordinate information of a test point on the transmission line, and controls the mechanical arm 5 to drive the probe holder 6 to grasp the probes 60 of the oscilloscope 3, and positions the probes 60 of the oscilloscope 3 on the PCB 7 according to the first command.

The oscilloscope 3 tests the signal on the test point, acquires a value of each test parameter of the signal on the test point, and transmits the values of each test parameter on the test point to the control computer 1 through the switch 2.

The determination module 14 compares the value of each test parameter on the test point with the reference value range of the test parameter, to determine if the value of the test parameter on the test point falls within the reference value range of the test parameter.

The control module 13 further generates a second command of removing the probes of the oscilloscope 3 from the PCB 7, if a value of any test parameter on the test point falls out of a corresponding reference value range, and controls the mechanical arm 5 to remove the probes 60 of the oscilloscope 3 from the PCB 7 according to the second command. In addition, the control module 13 controls the mechanical arm 5 to drive the probe holder 6 to grasp the probes 60 of the TDR 4, and positions the probes 60 of the TDR 4 on the PCB 7 according to the first command.

The TDR 4 tests an impedance value of the test point, and transmits the impedance value to the control computer 1 though the switch 2.

The determination module 14 further determines if the impedance value falls within the impedance reference value range of the transmission line, to determine if the test point passes the test.

The storage module 15 stores test results to the storage device 30, including the value of each test parameter on each test point, the impedance value of each test point, and a determination of whether the test point passes the test.

Figure 3:
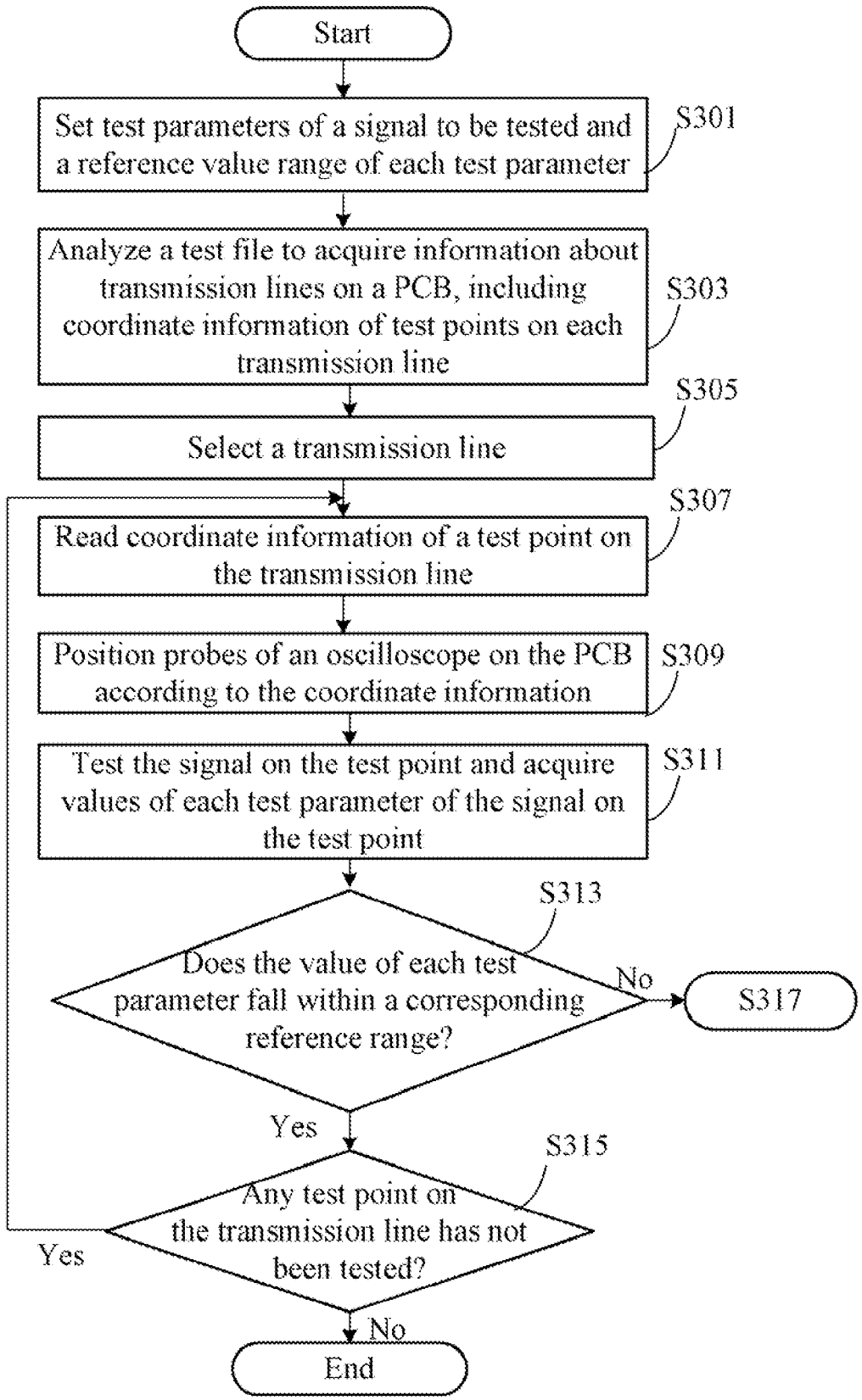
FIG. 3 and FIG. 4 are flowcharts of one embodiment of a signal integrity test method.
Figure 4:
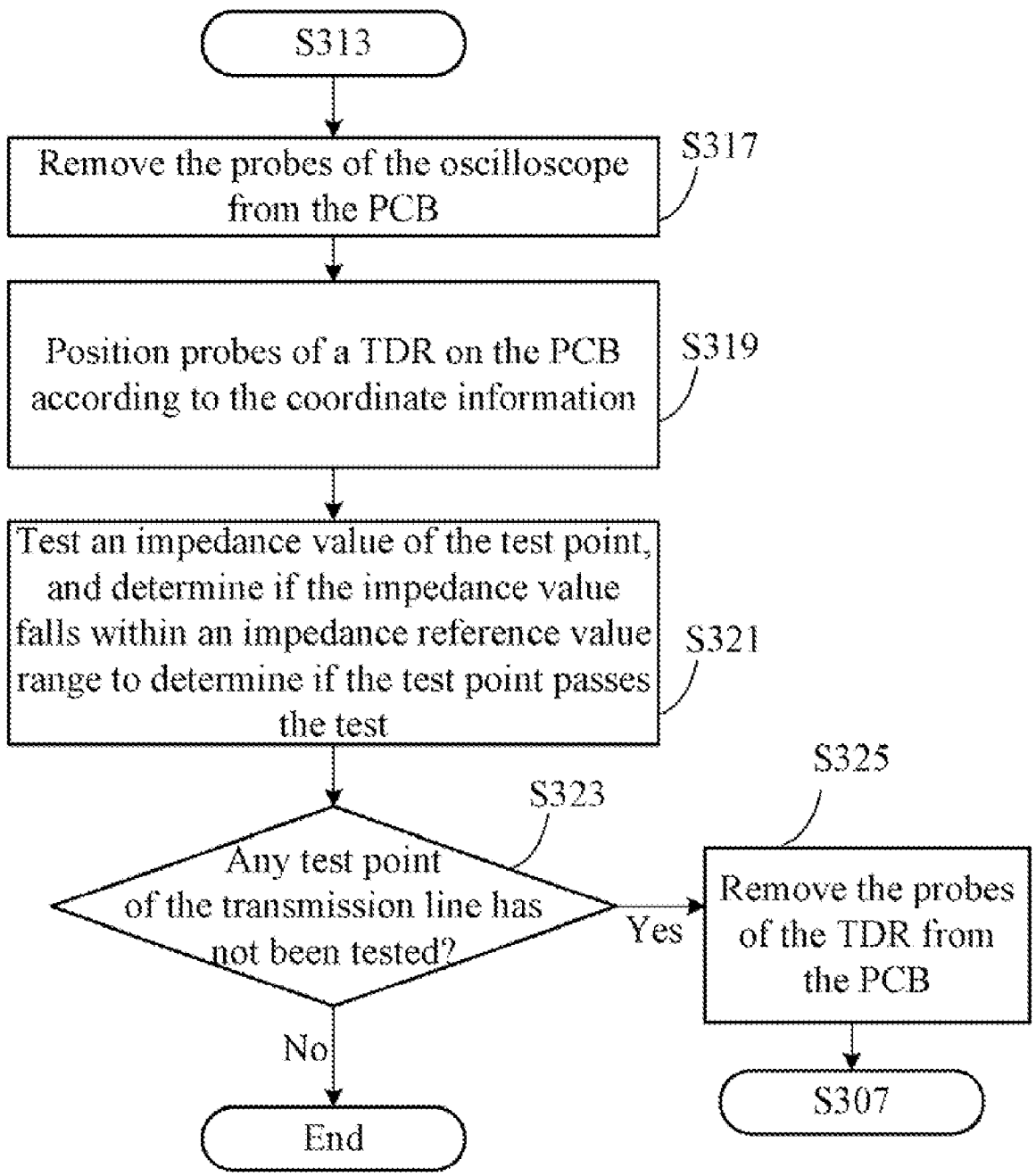

FIG. 3 and FIG. 4 are flowcharts of one embodiment of a signal integrity test method. The flowcharts only gives one transmission line as an example to show the test method. Depending on the embodiment, additional blocks may be added, others removed, and the ordering of the blocks may be changed. It should be noted that before starting the test method, the oscilloscope 3 and the TDR 4 should be checked, calibrated, and initialized, to ensure they can work normally.

In block S301, the setting module 11 receives test parameters of a signal to be tested and a reference value range of each test parameter set by a user. In this embodiment, the signal to be tested is a voltage signal. The test parameters may include an overshoot, an undershoot, a slew rate, a raise time, a fall time, a high voltage, and a low voltage of the voltage signal. The reference value range of each test parameter is stored to the storage device 30 by the storage module 15.

In block S303, the analysis module 12 reads the test file 20 from the storage device 30, and analyzes the test file 20 to acquire information about one or more transmission lines on the PCB 7. As mentioned above, the test file 20 may record a number of transmission lines on the PCB 7, a name and a length of each transmission line, coordinate information of test points on the transmission line, and a reference impedance value range of the transmission line.

In block S305, the analysis module 12 selects a transmission line to be tested. For example, the transmission line may be selected by its name.

In block S307, the analysis module 12 reads coordinate information of a test point on the transmission line. For example, coordinates of the test point may be (10, 12), where a unit is one millimeter.

In block S309, the control module 13 generates a first command according to the coordinate information of the test point, and controls the mechanical arm 5 to drive the probe holder 6 to grasp the probes 60 of the oscilloscope 3, and positions the probes 60 of the oscilloscope 3 on the PCB 7 according to the first command. For example, after receiving the first command, the mechanical arm 5 drives the probe holder 6 to grasp the probes 60 of the oscilloscope 3 and move the probes 60 along an X-axis with a distance of 10 millimeters, then move the probes 60 along a Y-axis with a distance of 12 millimeters, to position the probes 60 on the position (10, 12), where a unit is one millimeter.

In block S311, the oscilloscope 3 tests the signal on the test point (i.e., the position), acquires a value of each test parameter of the signal on the test point, and transmits the values of each test parameter on the test point to the control computer 1 through the switch 2.

In block S313, the determination module 14 compares the value of each test parameter on the test point with the reference value range of the test parameter, to determine if the value of each test parameter on the test point falls within the reference value range of the test parameter. If the value of each test parameter on the test point falls within the reference value range of the test parameter, the determination module 14 determines the test point passes the test, and the storage module 14 stores the value of each test parameter on the test point and the determination that the test point passes the test to the storage device 30. Then, the procedure goes to block S315, the determination module 14 checks if there is any test point on the transmission line has not been tested according to the information recorded in the test file 20. If there is any test point on the transmission line that has not been tested, the procedure returns to block S307, until all test points on the transmission line have been tested, the procedure ends.

Otherwise, if in block S313, the determination module 14 determines if the value of any test parameter on the test point falls out of the reference value range of the test parameter, the procedure goes to block S317. For example, supposing the reference value range of the higher voltage of the voltage signal is [5, 30], where a unit is volt. If the value of the higher voltage on the test point tested by the oscilloscope 3 is 4 volts, the determination module 14 determines that the value of the higher voltage on the test point falls out of the reference value range of the higher voltage, and the storage module 14 stores the value of each test parameter on the test point to the storage device 30. Then, the procedure goes to block S317.

In block S317, the control module 13 generates a second command of removing the probes 60 of the oscilloscope 3 from the PCB 7, and controls the mechanical arm 5 to remove the probes 60 of the oscilloscope 3 from the PCB 7 according to the second command.

In block S319, the control module 13 controls the mechanical arm 5 to drive the probe holder 6 to grasp the probes 60 of the TDR 4, and positions the probes 60 of the TDR 4 on the PCB 7 according to the first command. For example, as mentioned above, the mechanical arm 5 drives the probe holder 6 to grasp the probes 60 of the TDR 4 and move the probes 60 along an X-axis with a distance of 10 millimeters, then move the probes 60 along a Y-axis with a distance of 12 millimeters, to position the probes 60 on the position (10, 12), where a unit is one millimeter.

In block S321, the TDR 4 tests an impedance value of the test point, and transmits the impedance value to the control computer 1 though the switch 2. Then, the determination module 14 determines if the impedance value of the position falls within the reference impedance value of the transmission line, to determine if the test point passes the test. If the impedance value of the position falls within the reference impedance value of the transmission line, the storage module 15 stores the impedance value of the test point and a determination that the test point passes the test to the storage device 30. If the impedance value of the position falls out of the reference impedance value of the transmission line, the storage module 15 stores the impedance value of the test point and a determination that the test point fails the test to the storage device 30. Then, the procedure goes to block S323.

In block S323, the determination module 14 checks if there is any test point on the transmission line that has not been tested according to the information recorded in the test file 20. If all test points on the transmission line have been tested, the procedure ends. Otherwise, if there is any test point on the transmission line has not been tested, the procedure goes to block S325, the control module 13 generates a third command of removing the probes 60 of the of the TDR 4 from the PCB 7, and controls the mechanical arm 5 to remove the probes 60 of the TDR 4 from the PCB 7 according to the third command. Then, the procedure goes to block S307.

The signal integrity test system and method first uses the oscilloscope 3 to test a signal on each test point of a transmission line, obtain test parameter values of the signal on each test point, and compare the test parameter values with preset standard values. If any test parameter value does not match a corresponding preset standard value, the signal integrity test system and method then uses the TDR 4 to test the impedance value of the test point and determines whether the signal on the test point satisfies integrity requirements according to whether the impedance value matches a standard impedance value of the transmission line. As a result, only the test points on which the test parameter values of the signal does not match the preset standard values need to test impedance values. Furthermore, the system and method uses the mechanical machine 5 to position the probes 60 of the oscilloscope 3 or the TDR 4 on each test point.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A signal integrity test method applied in a control computer, the control computer in electronic communication with an oscilloscope, a time domain reflectometer (TDR), and a mechanical arm, the method comprising:
   (a) receiving test parameters of a signal transmitted on a printed circuit board (PCB) and a reference value range of each test parameter set by a user;
   (b) analyzing a test file stored in a storage device of the control computer, to acquire information about one or more transmission lines on the PCB;
   (c) selecting a transmission line on the PCB;
   (d) reading coordinate information of a test point on the transmission line;
   (e) generating a first command according to the coordinate information of the test point, and controlling the mechanical arm to position probes of the oscilloscope on the PCB according to the first command;
   (f) acquiring a value of each test parameter of the signal on the test point tested by the oscilloscope, comparing the value of each test parameter with the reference value range of the test parameter, to determine if the value of each test parameter falls within the reference value range of the test parameter;
   (g) determining the test point passes the test and going to block (i) if the value of each test parameter falls within the reference value range of the test parameter, or going to block (h) if the value of any test parameter falls out of the reference value range of the test parameter;
   (h) using the TDR to test an impedance value of the test point, and determining if the impedance value falls within the impedance reference value range of the transmission line, to determine if the test point passes the test; and
   (i) determining if there is any test point on the transmission line that has not been tested according to the information about transmission lines recorded in the test file, ending the test if all test points have been tested, or returning to block (d) if any test point on the transmission line has not been tested.

2. The method as claimed in claim 1, wherein using the TDR to test the impedance value of the test point in block (h) comprises:
   generating a second command of removing the probes of the oscilloscope from the PCB, and controlling the mechanical arm to remove the probes of the oscilloscope from the PCB according to the second command; and
   controlling the mechanical arm to position probes of the TDR on the PCB according to the first command.

3. The method as claimed in claim 1, wherein block (h) further comprises:
   determining the test point passes the test if the impedance value of the test point falls within the impedance reference value of the transmission line, or determining the test point fails the test if impedance value of the test point fall out of the impedance reference value of the transmission line.

4. The method as claimed in claim 3, wherein block (h) further comprising:
   storing the value of each test parameter on the test point, the impedance value of the test point and a determination result into the storage device.

5. The method as claimed in claim 1, wherein before returning to block (d) in block (i) further comprises:
   generating a third command of removing the probes of the TDR from the PCB, and controlling the mechanical arm to remove the probes of the TDR from the PCB according to the third command.

6. The method as claimed in claim 1, wherein the test parameters comprise:
   an overshoot, an undershoot, a slew rate, a raise time, a fall time, a high voltage, and a low voltage.

7. The method as claimed in claim 1, wherein the information about transmission lines recorded in the test file comprises:
   a number of transmission lines to be tested, a name and a length of each transmission line, and coordinate information of test points on the transmission line.

8. A signal integrity test system, comprising:
   a storage device;
   at least one processor; and
   one or more computerized codes stored in the storage device and executable by the at least one processor, the one or more computerized codes comprising:
   a setting module operable to receive test parameters of a signal transmitted on a printed circuit board (PCB) and a reference value range of each test parameter set by a user;
   an analysis module operable to analyze a test file stored the storage device, to acquire information about one or more transmission lines on the PCB, and select a transmission line on the PCB;
   a control module operable to generate a first command according to coordinate information of a test point on the transmission line, and control a mechanical arm to position probes of an oscilloscope on the PCB according to the first command;
   a determination module operable to acquire a value of each test parameter of the signal on the test point tested by the oscilloscope, compare the value of each test parameter with the reference value range of the test parameter, and determine the test point passes the test if the value of each test parameter falls within the reference value range of the test parameter;
   the control module further operable to generate a second command of removing the probes of the oscilloscope from the PCB if a value of any test parameter on the test point falls out of a corresponding reference value range, control the mechanical arm to remove the probes of the oscilloscope from the PCB according to the second command, and control the mechanical arm to position probes of an time-domain reflectometer (TDR) on the PCB according to the first command; and
   the determination module further operable to acquire an impedance value of the test point tested by the TDR, and determine if the impedance value falls within the impedance reference value range of the transmission line, to determine if the test point passes the test.

9. The system as claimed in claim 8, wherein the determination module determines the test point passes the test if the impedance value of the test point falls within the impedance reference value of the transmission line, or determines the test point fails the test if impedance value of the test point falls out of the impedance reference value of the transmission line.

10. The system as claimed in claim 9, further comprising:
a storage module operable to store test results to the storage device, wherein the test results comprise the value of each test parameter on the test point, the impedance value of each test point, and a determination of whether each test point passes the test.

11. The system as claimed in claim 8, wherein the test parameters comprise an overshoot, an undershoot, a slew rate, a raise time, a fall time, a high voltage, and a low voltage.

12. The system as claimed in claim 8, wherein the information about transmission lines recorded in the test file comprises a number of transmission lines to be tested, a name and a length of each transmission line, and coordinate information of test points on the transmission line.

13. The system as claimed in claim 8, wherein the storage device is a smart media card, a secure digital card, or a compact flash card.

14. A non-transitory computer readable medium storing a set of instructions, the set of instructions capable of being executed by a processor to perform a signal integrity test method, the method comprising:
(a) receiving test parameters of a signal transmitted on a printed circuit board (PCB) and a reference value range of each test parameter set by a user;
(b) analyzing a test file to acquire information about one or more transmission lines on the PCB;
(c) selecting a transmission line on the PCB;
(d) reading coordinate information of a test point on the transmission line;
(e) generating a first command according to the coordinate information of the test point, and controlling a mechanical arm to position probes of an oscilloscope on the PCB according to the first command;
(f) acquiring a value of each test parameter of the signal on the test point tested by the oscilloscope, comparing the value of each test parameter with the reference value range of the test parameter, to determine if the value of each test parameter falls within the reference value range of the test parameter;
(g) determining the test point passes the test and going to block (i) if the value of each test parameter falls within the reference value range of the test parameter, or going to block (h) if the value of any test parameter falls out of the reference value range of the test parameter;
(h) using a time-domain reflectometer (TDR) to test an impedance value of the test point, and determining if the impedance value of the test point falls within an impedance reference value of the transmission line, to determine if the test point passes the test; and
(i) determining if there is any test point on the transmission line that has not been tested according to the information about transmission lines recorded in the test file, ending the test if all test points have been tested, or returning to block (d) if any test point on the transmission line has not been tested.

15. The non-transitory computer readable medium as claimed in claim 14, wherein using the TDR to test the impedance value of the test point in block (h) comprises:
generating a second command of removing the probes of the oscilloscope from the PCB, and controlling the mechanical arm to remove the probes of the oscilloscope from the PCB according to the second command; and
controlling the mechanical arm to positon probes of the TDR on the PCB according to the first command.

16. The non-transitory computer readable medium as claimed in claim 14, wherein block (h) further comprises:
determining the test point passes the test if the impedance value of the test point falls within the impedance reference value of the transmission line, or determining the test point fails the test if impedance value of the test point fall out of the impedance reference value of the transmission line.

17. The non-transitory computer readable medium as claimed in claim 16, wherein block (h) further comprising:
storing the value of each test parameter on the test point, the impedance value of each test point and determination information into the storage device.

18. The non-transitory computer readable medium as claimed in claim 14, wherein before returning to block (d) in block (i) further comprises:
generating a third command of removing the probes of the TDR from the PCB, and controlling the mechanical arm to remove the probes of the TDR from the PCB according to the third command.

19. The non-transitory computer readable medium as claimed in claim 14, wherein the test parameters comprise an overshoot, an undershoot, a slew rate, a raise time, a fall time, a high voltage, and a low voltage.

20. The non-transitory computer readable medium as claimed in claim 14, wherein the information about transmission lines recorded in the test file comprises a number of transmission lines to be tested, a name and a length of each transmission line, and coordinate information of test points on the transmission line.

* * * * *